(12) United States Patent
Saito

(10) Patent No.: US 7,795,654 B2
(45) Date of Patent: Sep. 14, 2010

(54) SOLID-STATE IMAGING DEVICE AND METHOD FOR PRODUCING THE SAME

(75) Inventor: Maki Saito, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 57 days.

(21) Appl. No.: 11/499,766

(22) Filed: Aug. 7, 2006

(65) Prior Publication Data
US 2007/0034869 A1 Feb. 15, 2007

(30) Foreign Application Priority Data
Aug. 9, 2005 (JP) .......................... P.2005-231011

(51) Int. Cl.
*H01L 31/062* (2006.01)
*H01L 31/113* (2006.01)
(52) U.S. Cl. .................. 257/292; 257/291; 257/294; 257/59; 257/222; 257/E27.151
(58) Field of Classification Search ................ 257/291, 257/292, 294, 59, 215, 222, E27.15–E27.152
See application file for complete search history.

(56) References Cited

U.S. PATENT DOCUMENTS 6,251,719 B1 * 6/2001 Wang .......................... 438/238
7,233,037 B2 * 6/2007 Nakahashi et al. .......... 257/291
7,608,871 B2 * 10/2009 Aita et al. .................... 257/291
2004/0118993 A1 * 6/2004 Suzuki ...................... 250/214.1
2004/0222448 A1 * 11/2004 Takao ......................... 257/291
2005/0274996 A1 * 12/2005 Iwawaki ..................... 257/292
2007/0034981 A1 * 2/2007 Saito .......................... 257/462

FOREIGN PATENT DOCUMENTS

| JP | 5-129583 A | 5/1993 |
|---|---|---|
| JP | 2003-197896 A | 7/2003 |
| JP | 2004-281721 A | 10/2004 |

* cited by examiner

*Primary Examiner*—Anh Phung
*Assistant Examiner*—Allison P Bernstein
(74) *Attorney, Agent, or Firm*—Birch, Stewart, Kolasch & Birch, LLP

(57) ABSTRACT

In the solid-state imaging device of the present invention having a photoelectric conversion section and a charge transfer section equipped with a charge transfer electrode for transferring an electric charge generated in the photoelectric conversion section, the charge transfer electrode has an alternate arrangement of a first layer electrode comprising a first conductive film and a second layer electrode comprising a second conductive film, and the first layer electrode and the second layer electrode are separated by insulation with an interelectrode insulating film having a two-layer structure comprising a sidewall insulating film consisting of a first insulating layer formed by a CVD method to cover the lateral wall of the first layer electrode and a second insulating film.

7 Claims, 8 Drawing Sheets

SOLID-STATE IMAGING DEVICE AND METHOD FOR PRODUCING THE SAME

BACKGROUND OF THE INVENTION

1. Field of the Invention

The present invention relates to a solid-state imaging device and a method for producing the same, more specifically, the present invention relates to the formation of an interelectrode insulating film of a solid-state imaging device.

2. Background Art

The solid-state imaging device utilizing CCD (Charge Coupled Device) used for an area sensor and the like has a photoelectric conversion section comprising a photodiode or the like and a charge transfer section equipped with a charge transfer electrode for transferring a signal charge from the photoelectric conversion section. As for the charge transfer electrode, plural charge transfer electrodes are adjacently disposed on a charge transfer path formed on a semiconductor substrate and sequentially driven.

With recent development of CCD having a large number of pixels, demands for high resolution and high sensitivity of a solid-state imaging device are more and more increasing, and the number of imaging pixels has been increased to giga-pixels or more.

Under these circumstances, since reduction of the light-receiving area must be avoided to ensure high sensitivity, it is obliged to reduce the occupation area of the charge transfer electrode.

Incidentally, the interelectrode insulating film provided between charge transfer electrodes can be thinly formed by the oxidation (900 to 950° C.) of an electrode material. However, in order to form a thin and good-quality oxide film, the oxidation temperature needs to be high of 900° C. or more as described above and impurity diffusion on the substrate side proceeds due to heat history by oxidation, incurring various problems such as deterioration of transfer efficiency and reduction of sensitivity.

In this way, the formation of an interelectrode insulating film by using thermal oxidation is a big obstacle standing in the way of developing a fine (high-quality) solid-state imaging device with a large number of pixels.

To solve this problem, a charge transfer electrode having a multilayer structure where the interelectrode insulting film is formed by a CVD (Chemical Vapor Deposition) method has been proposed with an attempt to reduce the temperature at the formation of the interelectrode insulating film (refer to JP-A-2003-197896 (the term "JP-A" as used herein means an "unexamined published Japanese patent application")).

In the case of a charge transfer electrode having a single-layer electrode structure, when the formation of an interelectrode gap and the embedding of an insulating film therein are performed by a one-time photolithography process, a fine pattern exceeding the resolution limit can be hardly formed and moreover, the embedding of an insulting film in the interelectrode gap having a high aspect ratio is extremely difficult. By taking account of such situation, there has been proposed a structure where a sidewall is formed as an interelectrode insulating film on the lateral wall of a first layer electrode formed alternately and a second layer electrode is formed through the sidewall (refer to JP-A-5-129583) In such circumstances, for the purpose of high integration, the present inventors have proposed a solid-state imaging device where a sidewall comprising a silicon oxide film formed by a low-temperature CVD method is used for one lateral wall of adjacent charge transfer electrodes (refer to Japanese Patent Application No. 2004-281721).

Such a sidewall structure is an excellent structure requiring no photolithography process and being self-alignedly formable by anisotropic etching. In many cases, the gate oxide film has been conventionally constituted by a three-layer structure comprising a 25 nm-thick silicon oxide film (bottom oxide film), a 50 nm-thick silicon nitride film, and a 10 nm-thick silicon oxide film (top oxide film). At the anisotropic etching, the silicon nitride film of the three-layer structure gate oxide film works as a stopper, and the film loss of the gate oxide film is allowed to occur only in the top oxide film. Accordingly, the anisotropic etching enables efficient formation of a charge transfer electrode with high reliability.

In this way, in the production of a solid-state imaging device, it is demanded to avoid a process at a temperature as high as incurring extension of the diffusion length of an already doped impurity, for ensuring a finer fabrication tolerance, prevent deterioration of the charge transfer efficiency, and realize high-speed driving and high-quality image output. To cope with these requirements, a CVD method, particularly, a CVD method performed at a low temperature of 700 to 850° C., has been introduced.

On the other hand, the structure using an ONO (Oxide Nitride Oxide) film for the gate oxide film has a problem that an electric charge is readily trapped into the silicon nitride film to cause voltage shift due to depletion particularly in the read-out section to which a high voltage is applied, and a malfunction may occur.

From this reason, the fine fabrication of a solid-state imaging device is associated with a demand for a structure not containing silicon nitride in the gate oxide film, further a structure equipped with a thin gate oxide film having high withstand voltage.

SUMMARY OF THE INVENTION

An object of the present invention is to provide a solid-state imaging device free from characteristic deterioration by preventing charge trapping into the gate oxide film and assured of high reliability by using a high-quality interelectrode insulating film which is easily microfabricated.

(1) A solid-state imaging device comprising: a semiconductor substrate; a photoelectric conversion section; a charge transfer section comprising a charge transfer electrode transferring an electric charge generated in the photoelectric conversion section, the charge transfer electrode comprising: a first electrode comprising a first conductive film; and a second electrode comprising a second conductive film; a gate oxide film at least below the first electrode comprising a silicon oxide film, the first electrode and the second electrode being disposed on through the gate oxide film and alternatively arranged; and a interelectrode insulating film comprising a sidewall insulating film covering the lateral wall of the first electrode, the interelectrode insulating film separating and insulating the first electrode from the second electrode, the sidewall insulating film comprises: a first insulating film covering from the lateral wall of the first layer electrode to the top of the gate oxide film; and a second insulating film provided on the first insulating film.

According to this constitution, the interelectrode insulating film is formed to cover from the lateral wall of the first layer electrode to the top of the gate oxide film on the substrate surface, so that a two-layer structure can be unfailingly formed near the edge where electric field and a highly reliable solid-state imaging device having high withstand voltage can be provided. Also, since a highly reliable structure can be formed even when the gate oxide film does not contain a silicon nitride film, the gate oxide film can be composed of a silicon oxide film and charge trapping thereinto can be prevented.

(2) The solid-state imaging device as described in the item (1), wherein the first insulating film comprises a metal oxide thin film having an insulation property.

According to this constitution, the first insulating film comprises a metal oxide thin film such as aluminum oxide, so that even when the second insulating film is composed of a silicon oxide film, satisfactory etching selectivity can be ensured and a highly reliable electrode structure can be formed without causing film loss of the gate oxide film. Furthermore, even in the case where the metal oxide thin film as the first insulating film is caused to remain as it is, this constitutes a part of the gate oxide film below the second layer electrode, so that a thin charge transfer electrode structure with high withstand voltage can be obtained.

(3) The solid-state imaging device as described in the item (1), wherein the first insulating film comprises a silicon nitride film.

According to this constitution, a dense interelectrode insulating film with high withstand voltage ensuring good etching selectivity to silicon oxide can be obtained.

(4) The solid-state imaging device as described in the item (2), wherein the metal oxide thin film comprises at least one element selected from the group consisting of Al, Ti, Hf, Zr, La and Y.

According to this constitution, even when the metal oxide thin film is caused to remain as the gate oxide film of the second layer electrode, a dense and highly reliable gate oxide film can be obtained. Also, by virtue of good etching selectivity to silicon oxide, a dense interelectrode insulating film with high withstand voltage can obtained. Furthermore, the threshold voltage can be controlled by adjusting the Al concentration in the Hf oxide, and a structure where the dielectric constant is increased by decreasing the Al concentration in the read-out region is also effective.

(5) The solid-state imaging device as described in any one of the items (1) to (4), wherein the second insulting film has an etching selectivity to the first insulating film.

According to this constitution, a sidewall can be successfully formed without etching the gate oxide film.

(6) The solid-state imaging device as described in any one of the items (1) to (5), wherein the second insulating film comprises a silicon oxide film.

According to this constitution, a highly reliable sidewall can be formed without increasing the interelectrode capacitance.

(7) The solid-state imaging device as described in the item (6), wherein the silicon oxide film comprises a silicon oxide film formed by a chemical vapor deposition method.

According to this constitution, the film quality can be enhanced and a highly reliable interelectrode insulating film can be formed. The silicon oxide (HTO) film can be formed at a low temperature and has a dense and good film quality, so that a high-quality sidewall insulating film can be formed. As for the film-forming conditions of the HTO film, the film is preferably formed at a substrate temperature of 700 to 850° C.

(8) The solid-state imaging device as described in the item (1), wherein the gate oxide film comprises a silicon oxide film and a metal oxide film.

According to this constitution, for example, after a sidewall is formed by using the silicon nitride film as the stopper and the silicon nitride in the second layer electrode-forming region is removed, a film different from the silicon oxide film, such as metal oxide thin film, may be formed in the region from which the silicon nitride is removed. By the formation of such a film, the thickness or dielectric constant of the gate oxide film can be adjusted. Furthermore, the dielectric constant may also be adjusted, for example, by a method of changing the aluminum content in the hafnium oxide in the read-out region.

In addition, when the first conductive film and the second layer electrically conducting film are composed of a silicon-based electrically conducting film, the single-layer fabrication can be easily attained by CMP or etch back and therefore, the processing is facilitated.

In the case of constructing a two-layer electrode structure, when the first conductive film and the second conductive film are composed of a polymetal, flattening is possible and the resistance is low, so that both thickness reduction and high-speed driving can be realized and in turn, a high-sensitivity highly reliable solid-state imaging device capable of microfabrication can be obtained.

This constitution is effective particularly in the fabrication of a solid-state imaging device having a microfine structure where the interelectrode distance between the first and second electrodes, that is, the thickness of the interelectrode insulating film, is 0.1 µm or less.

When the interelectrode distance is 0.1 µm or less, pattern formation is difficult, but according to this method, the pattern can be easily formed by a lateral wall leaving technique utilizing CVD or anisotropic etching of an oxide film. Furthermore, by virtue of the two-layer structure, withstand voltage can be ensured despite small film thickness and a fine pattern can be easily formed.

(9) A method for producing a solid-state imaging device, the solid-state imaging device having a photoelectric conversion section and a charge transfer section equipped with a charge transfer electrode for transferring an electric charge generated in the photoelectric conversion section, comprising: forming a first electrode comprising a first conductive film; sequentially forming a first insulating film and a second insulating film on the top of the first electrode; anisotropically etching the second insulating film by using the first insulating film as an etching stopper to form a sidewall insulating film on the lateral wall of the first layer electrode; and forming a second electrode comprising a second conductive film so that the first electrode can be insulated and separated from the second electrode across the sidewall insulating film.

According to this constitution, a sidewall can be successfully formed without using the gate oxide film as an etching stopper and therefore, the material is not limited, so that a compact and highly reliable solid-state imaging device can be fabricated.

(10) A method for producing a solid-state imaging device as described in the item (9), wherein the forming of the second electrode comprises removing and flattening the second conductive film on the first electrode separating the second conductive film so that a second electrode can be formed between the first electrodes.

According to this constitution, a single-layer electrode structure can be efficiently obtained.

(11) A method for producing a solid-state imaging device as described in the item (9), wherein the second electrode comprises a silicon oxide film formed by a chemical vapor deposition method.

According to this constitution, a highly reliable solid-state imaging device can be obtained without passing through a high-temperature process.

(12) A method for producing a solid-state imaging device as described in the item (9), which comprises: removing the first insulating film on the gate oxide film after the forming of the sidewall insulating film, the first insulating film exposed from the sidewall insulating film.

According to this constitution, the first insulating film on the gate oxide film is removed, so that even when the first insulating film is composed of silicon nitride, trapping of an electric charge can be prevented from occurrence below the second layer electrode.

(13) A method for producing a solid-state imaging device as described in the item (11), which comprises: forming a third insulating film in the region where the first gate oxide film is removed.

According to this constitution, when the first insulating film on the gate oxide film is removed and then the film loss portion on the gate oxide film is supplemented by a third insulating film such as silicon oxide film, a desired gate oxide film can be obtained and a high-performance charge transfer section can be formed.

Furthermore, when the second insulating film constituting the sidewall insulating film is formed by a CVD method, a good-quality interelectrode insulating film can be self-alignedly formed at a low temperature. The film-forming temperature of this second insulating film working out to the sidewall insulating film is preferably on the order of 700° C. to 850° C.

By virtue of such film formation, a dense and high-quality sidewall insulating film can be efficiently formed at a low temperature (approximately from 700 to 850° C.).

(14) A method for producing a solid-state imaging device as described in the item (9), wherein the forming the first electrode comprises: forming a first conductive film; forming a hard mask comprising an insulting film on the first conductive film; and selectively removing the first conductive film by using the hard mask.

According to this method, a first layer electrode pattern with high precision and high reliability can be formed. Also, this hard mask acts as a removal-suppressing layer (stopper layer) of suppressing the removal of the first layer electrode at the time of flattening the second conductive film, so that a flat surface can be efficiently formed without bringing about film loss.

The present invention includes the above-described method for producing a solid-state imaging device, wherein the hard mask is a single-layer film comprising a silicon oxide film, and the second conductive film is laminated on the hard mask.

(15) A method for producing a solid-state imaging device as described in the item (13), wherein the hard mask comprises a two-layer film containing a silicon oxide film and a silicon nitride film, and the first insulating film is laminated on the hard mask.

According to this method, the first layer electrically conducting film constituting the first layer electrode can be prevented from contamination at the resist ashing. Furthermore, the hard mask successfully acts as a removal-suppressing layer for the first layer electrode in the patterning process of the second conductive film and also successfully acts as a removal-suppressing layer on the first layer electrode at the time of forming a sidewall insulating film by anisotropic etching after the patterning of the first layer electrically conducting film.

In the case of forming a single-layer electrode structure by performing flattening with use of CMP (Chemical Mechanical Polishing) or a resist etch back process after the second conductive film is formed, the hard mask successfully acts as a removal-suppressing layer for the first layer electrode.

According to the present invention, the interelectrode insulating film is composed of a sidewall insulating film formed as a laminate structure consisting of a first insulating film and a second insulating film on the lateral wall of the first layer electrode and therefore, even when the gate oxide film is silicon oxide, a fine solid-state imaging device capable of ensuring high withstand voltage with high precision and high reliability can be fabricated. Also, the interelectrode insulating film is composed of a sidewall insulting film having a two-layer structure consisting of a first insulating film and a second insulating film and therefore, a charge transfer electrode with high withstand voltage and high reliability can be obtained even when a narrow gap is allowed. In addition, the reliability can be enhanced by adjusting the gate oxide film below the first and second layer electrodes.

Furthermore, according to the method of the present invention, even when the gate oxide film is silicon oxide, the first insulating film can be used as a stopper film at the formation of the sidewall insulating film and a highly reliable solid-state imaging device can be obtained.

BREIF DESCRIPTION OF THE DRAWINGS

The invention disclosed herein will be understood better with reference to the following drawings of which:

DETAILED DESCRIPTION OF THE INVENTION

Figure 1:
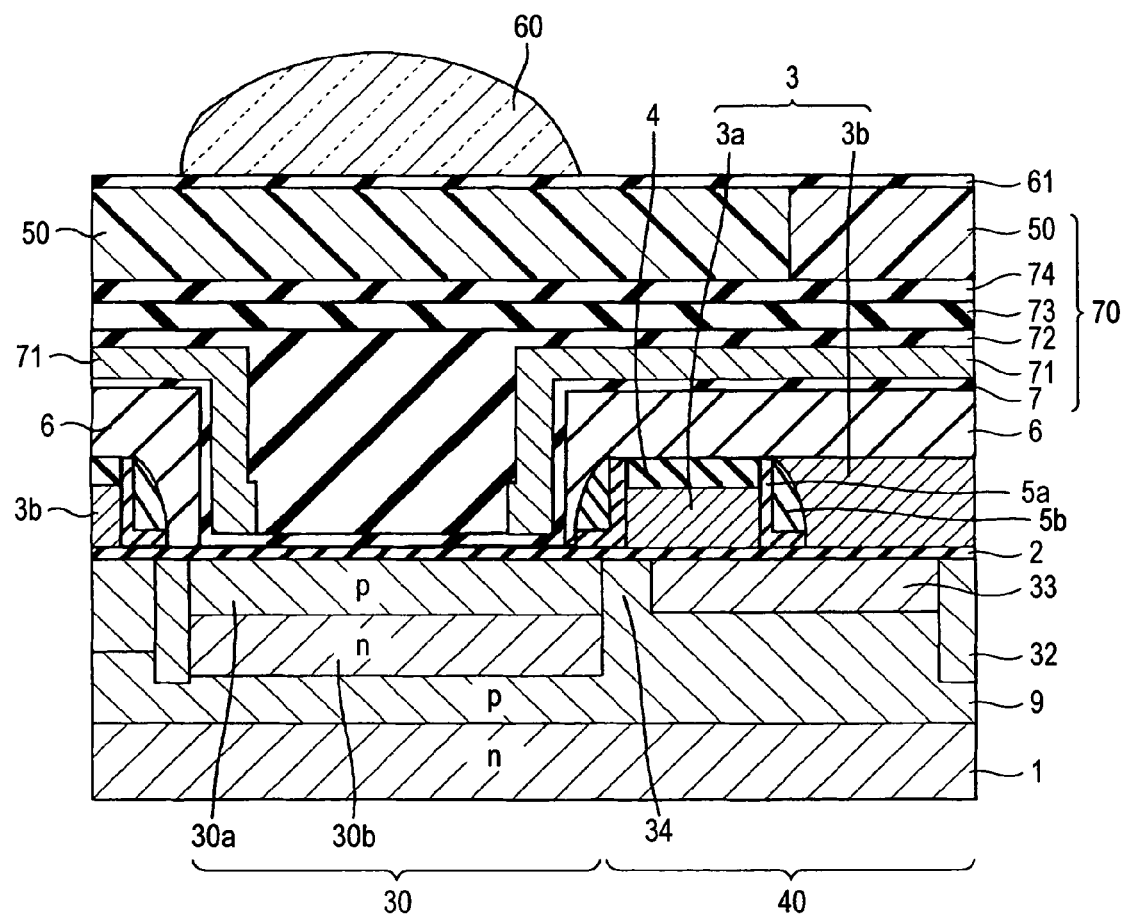
FIG. 1 is a cross-sectional view that illustrates the solid-state imaging device in Embodiment 1 of the present invention.

Exemplary embodiments of the present invention are described below by referring to the drawings.

Embodiment 1

Figure 2:
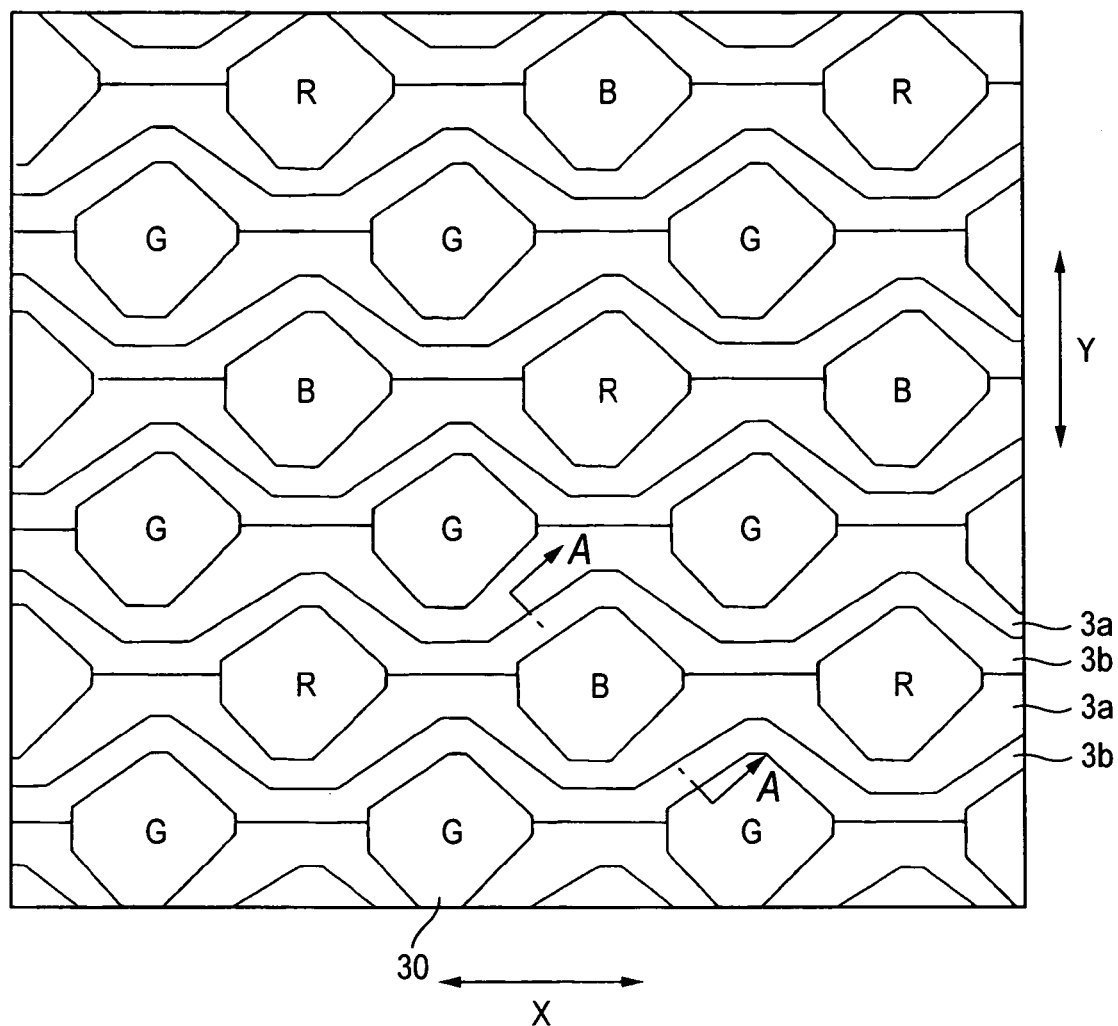
FIG. 2 is a top view that illustrates the solid-state imaging device in Embodiment 1 of the present invention.

This solid-state imaging device is characterized in that, as illustrated in FIGS. 1 and 2, a first layer electrode 3*a* comprising a polycrystalline silicon layer as the first conductive film and a second layer electrode 3b comprising a polycrystalline silicon layer as the second conductive film are alternately juxtaposed to form a charge transfer electrode, and the interelectrode insulating film is composed of a first insulating film 5a comprising a silicon nitride film covering from the lateral wall of the first layer electrode to the top of the gate oxide film and a second insulating film 5b comprising an HTO film (silicon oxide film) formed on the first insulating film 5a by a CVD method. The numeral 6 is a silicon oxide film. FIG. 1 is a cross-sectional view, and FIG. 2 is a plan view. FIG. 1 is an A-A cross-sectional view of FIG. 2.

According to this constitution, the interelectrode insulating film is composed of a sidewall insulating film consisting of a first insulating film 5a comprising a silicon nitride film and a second insulating film 5b comprising an HTO film formed by a CVD method, so that a high-quality sidewall insulating film with high withstand voltage can be formed at a low temperature without causing film loss of the gate oxide film and the extension of the diffusion length can be prevented. Furthermore, a first layer electrode 3a and a second layer electrode 3b are alternately juxtaposed, so that a single-layer electrode structure having a flat surface can be easily formed.

Other structures are the same as those of the conventional solid-state imaging device. That is, the solid-state imaging device is characterized by: comprising a photoelectric conversion section 30 and a charge transfer section 40 equipped with a charge transfer electrode for transferring an electric charge generated in the photoelectric conversion section 30; comprising an intermediate layer 70 including, for example, a light-shielding film (not illustrated) formed to have an opening in the photoelectric conversion section and a flattening film comprising a BPSG (borophosphosilicate glass) film filled in the photoelectric conversion section to give a nearly flat surface; and further forming a filter 50 and a lens 60 on the intermediate layer.

By virtue of such a constitution, an interelectrode insulating film can be easily formed without deterioration of the gate oxide film, and good flattening of the surface and great reduction in the thickness can be attained.

Incidentally, this gate oxide film 2 is composed of a silicon oxide film and free from a silicon nitride film, and the trapping of an electric charge can be reduced.

On the silicon substrate 1, a plurality of photodiode regions 30 are formed, and a charge transfer section 40 for transferring a signal charge detected in the photodiode region 30 is formed between photodiode regions 30.

The charge transfer channel allowing for travelling of the signal charge transferred by the charge transfer electrode is not illustrated in FIG. 2 but is formed in the direction intersecting with the direction to which the charge transfer section 40 is extending.

As for the interelectrode insulating film, those formed in the vicinity of the boundary between the photodiode region 30 and the charge transfer section 40 are omitted in FIG. 2.

As illustrated in FIG. 1, in the silicon substrate 1, a photodiode 30, a charge transfer channel 33, a channel stop region 32 and a charge read-out region 34 are formed, and on the surface of the silicon substrate 1, a gate oxide film 2 is formed. On the surface of the gate oxide film 2, charge transfer electrodes (a first layer electrode comprising a first conductive film 3a and a second layer electrode comprising a second conductive film 3b) are formed and juxtaposed with intervention of an interelectrode insulating film 5 which is a sidewall insulating film consisting of a first insulting film 5a comprising a silicon nitride film formed on the lateral wall of the first layer electrode 3a and a second insulating film 5b comprising an HTO film, and thereby a single-layer electrode structure is constructed.

The charge transfer section 40 is as described above, but as illustrated in FIG. 1, an intermediate layer 70 is formed on the top of the charge transfer electrode of the charge transfer section 40. More specifically, an antireflection layer 7 comprising a silicon nitride film is formed, a light-shielding film 71 is provided in the portion excluding the photodiode region 30 (photoelectric conversion section), and a flattening film 72 comprising a BPSG film is formed in the recess part. Furthermore, a passivation film 73 comprising a transparent resin film, and a flattening layer 74 under filter are provided thereon.

On the top of the intermediate layer 70, a color filter 50 (50B, 50G) and a microlens 60 are provided. If desired, a flattening layer 61 comprising an insulating transparent resin or the like may be filled between the color filter 50 and the microlens 60.

In this Example, a solid-state imaging device having a so-called honeycomb structure is described, but the same is of course applicable also to a square lattice-type solid-state imaging device.

The production process of this solid-state imaging device is described in detail below by referring to FIGS. 3 and 4.

First, a gate oxide film 2 comprising a silicon oxide film having a film thickness of 70 nm is formed on the surface of an n-type silicon substrate 1 having an impurity concentration of about $1.0 \times 10^{16}$ cm$^{-3}$.

Subsequently, a first layer polycrystalline silicon film as a first conductive film (3a) having a film thickness of 50 to 300 nm is formed on the gate oxide film 2 by a reduced-pressure CVD method. The substrate temperature here is set to 500 to 600° C. On this layer, an HTO film 4 having a film thickness of 50 to 300 nm is sequentially laminated by a CVD method at a substrate temperature of 850° C. (from 700 to 850° C.).

Thereafter, a resist pattern (not illustrated) is formed by photolithography and through this pattern as the mask, the HTO film 4 is etched by reactive ion etching using $CHF_3$, $C_2F_6$, $O_2$ and He. Then, the resist pattern is removed by ashing to form a hard mask comprising the HTO film 4 (FIG. 3A).

By using the thus-obtained hard mask comprising the HTO film 4, the first conductive film 3a is etched. At the etching, reactive ion etching using a mixed gas of HBr and $O_2$ is performed to form a first layer electrode and wiring of peripheral circuits. Here, an etching apparatus such as ECR (electron cyclotron resonance) system or ICP (inductively coupled plasma) system is preferably used.

Figure 3A:
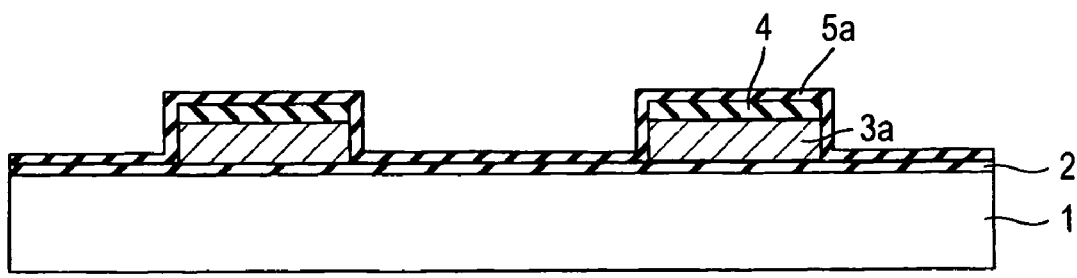
FIGS. 3A to 3C are views that illustrate the production process of the solid-state imaging device in Embodiment 1 of the present invention.

On this layer, a first insulating film 5a comprising a silicon nitride film having a film thickness of 3 to 20 nm is formed by a reduced-pressure CVD method (FIG. 3A).

Figure 3B:
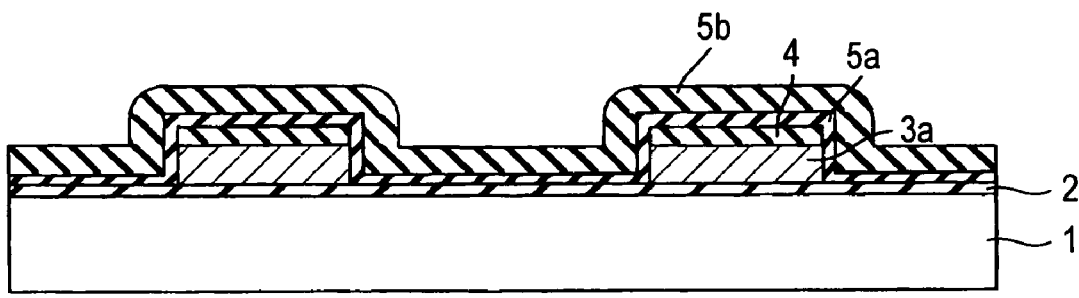

Furthermore, on this layer, a second insulating film 5b comprising a silicon oxide film having a film thickness of 30 to 200 nm is formed by a CVD method (FIG. 3B). Here, these first and second insulating films are preferably formed such that the total film thickness is 100 nm or less.

Figure 3C:
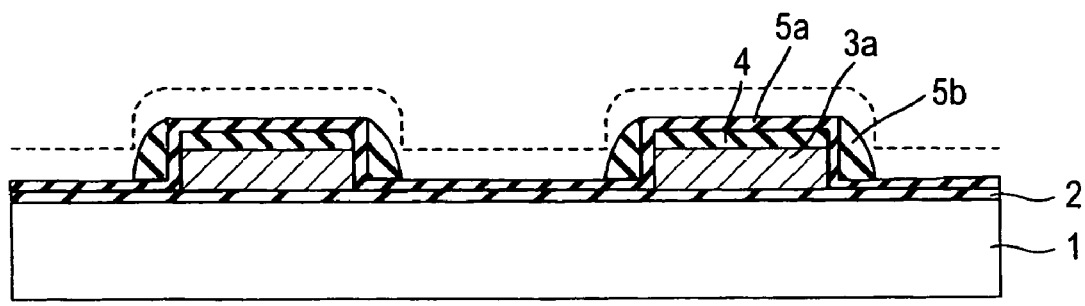

Then, the silicon oxide film 5b accumulated in the horizontal portions is removed by reactive ion etching and allowed to remain on the lateral wall, thereby forming a sidewall (insulating film) (FIG. 3C). At this time, the first insulating film 5a comprising a silicon nitride film acts as an etching stopper.

Figure 4A:
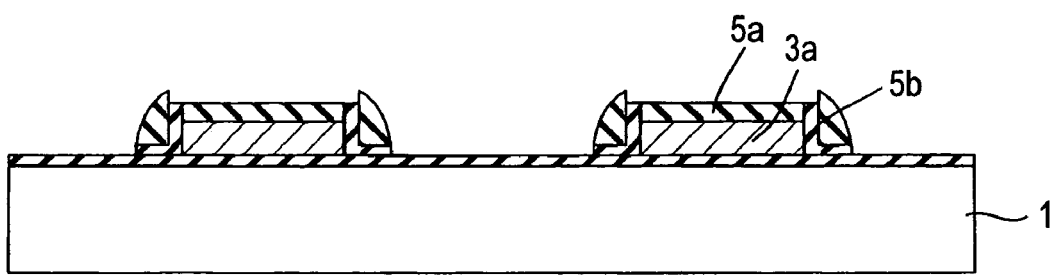
FIGS. 4A to 4C are views that illustrate the production process of the solid-state imaging device in Embodiment 1 of the present invention.

Subsequently, the first insulating film used as an etching stopper film is removed by etching (FIG. 4A). At this time, the first insulating film 5a in the portion covered by the second insulating film remains.

Figure 4B:
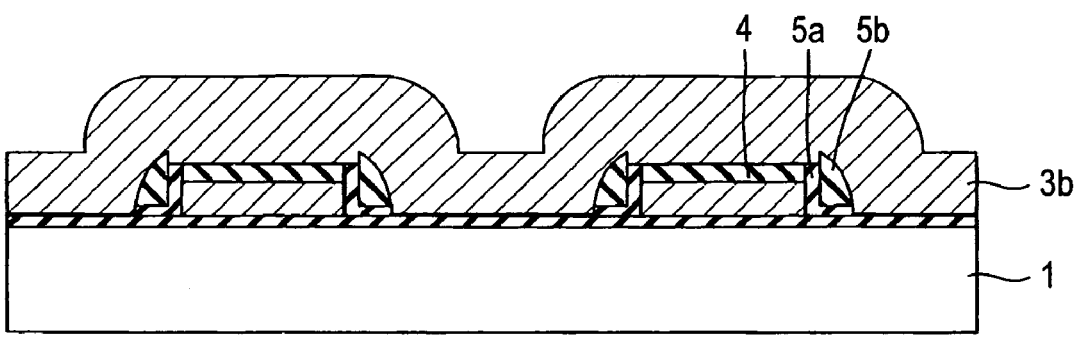

Then, a polycrystalline silicon film as the second conductive film 3b is formed thereon by a reduced-pressure CVD method to a thickness larger than the height of the first conductive film 3a. At this time, the substrate temperature is set to 500 to 600° C. (FIG. 4B).

Figure 4C:
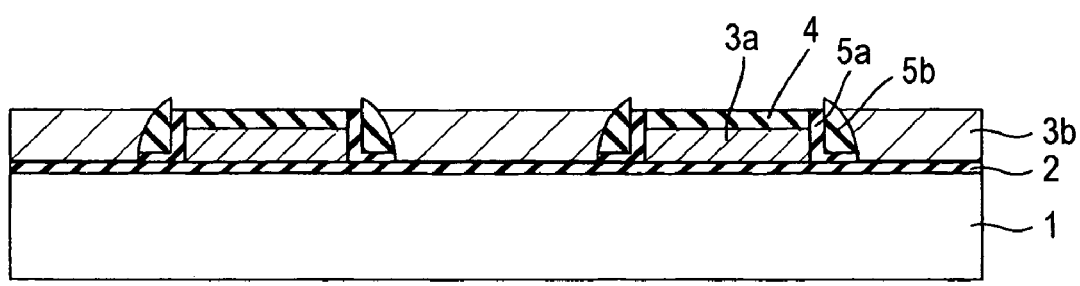

Furthermore, the second conductive film 3b in the projected portions is removed by an etch back process to flatten the surface (FIG. 4C). In this way, the charge transfer section is formed.

Thereafter, an HTO film 6 having a film thickness up to 50 nm and a silicon nitride film 7 as an antireflection film are formed by a reduced-pressure CVD method (see, FIG. 1).

Subsequently, patterning of the second layer electrode (second conductive film) is performed by photolithography, thereby opening a window in the photoelectric conversion section.

After forming an intermediate layer 70 such as antireflection film, light-shielding layer and flattening layer, a color filter 50, a microlens 60 and the like are formed to obtain a solid-state imaging device illustrated in FIGS. 1 and 2.

According to this solid-state imaging device, the sidewall is formed in a two-layer structure without using the silicon nitride film of the gate oxide film as an etching stopper, so that a good sidewall can be formed by the use of the first insulating film as an etching stopper and a compact and highly reliable solid-state imaging device can be fabricated without limitation in the material. Furthermore, the second insulating film is composed of an HTO film and a low-resistance single-layer structure electrode is constructed at a low temperature, so that a high-precision fine solid-state imaging device can be fabricated without extension of diffusion length and high-speed driving and microfabrication can be realized.

According to this method, a fine structure having an interelectrode distance of about 0.1 μm or less can be formed.

Incidentally, the etching stopper layer used at the anisotropic etching for forming the sidewall is the first insulating film 5a and therefore, film loss due to overpolishing of the gate oxide film can be prevented.

Embodiment 2

In Embodiment 1, a silicon nitride film is used as the first insulting film, but a high dielectric thin film such as aluminum oxide may also be used in place of the silicon nitride film.

According to this constitution, a thin film is sufficient because of its high etching selectivity and high dielectric constant, so that finer fabrication can be attained.

Embodiment 3

The patterning of the first layer electrode sometimes brings about film loss of the gate oxide film, but in this Embodiment, the film loss is supplemented by forming the silicon oxide film by a CVD method.

Figure 5A:
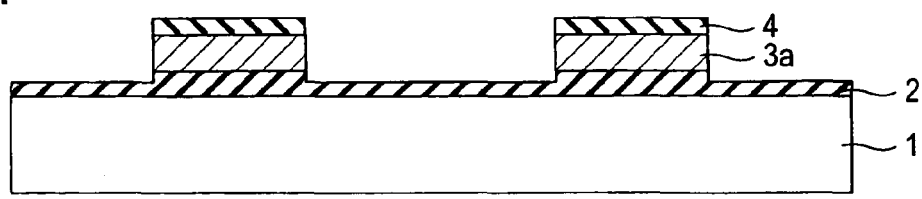
FIGS. 5A to 5D are views that illustrate the production process of the solid-state imaging device in Embodiment 3 of the present invention.
Figure 5B:
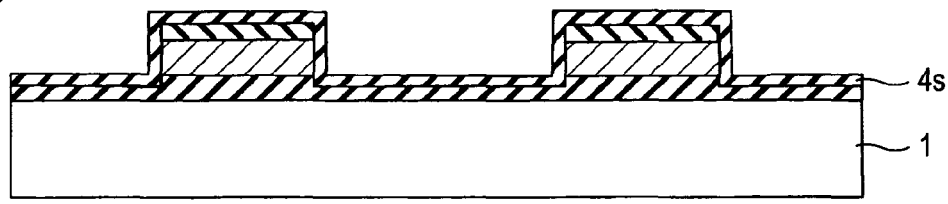

That is, when a polycrystalline silicone film 3a is formed on a gate oxide film 2 comprising a silicon oxide film and after forming an HTO film 4 as the mask, patterning is performed, the silicon oxide of the gate oxide film 2 is slightly shaved (FIG. 5A). Accordingly, in this Embodiment 1, a silicon oxide film 4S (Fig. 5B) is laminated by a CVD method so as to supplement the film loss of the silicon oxide film 4.

Figure 5C:
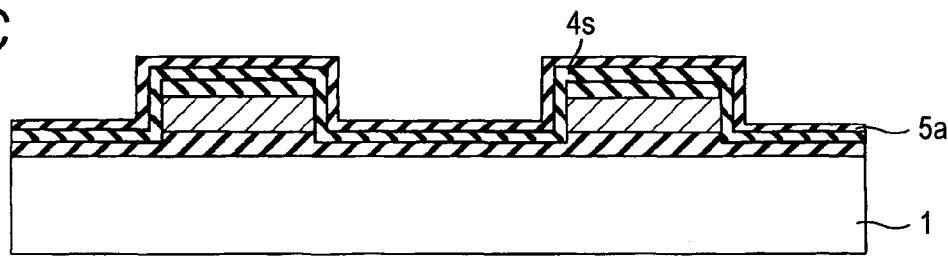

Thereafter, a silicon nitride film as the first insulating film 5a working out to the stopper is formed by a CVD method (FIG. 5C).

Figure 5D:
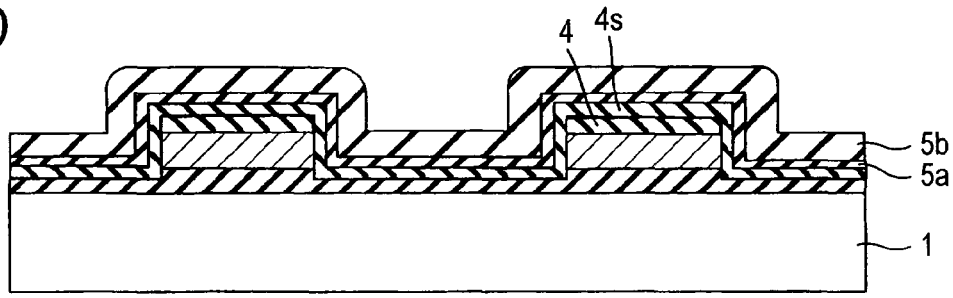

On this layer, a second insulating film 5b comprising a silicon oxide film is formed (FIG. 5D).

Figure 6A:
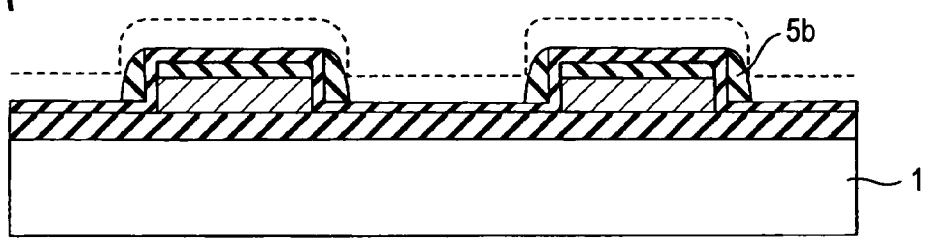
FIGS. 6A to 6D are views that illustrate the production process of the solid-state imaging device in Embodiment 3 of the present invention.

Then, the silicon oxide film 5b accumulated in the horizontal portions is removed by reactive ion etching and allowed to remain on the lateral wall, thereby forming a sidewall (insulating film) (FIG. 6A). At this time, the first insulating film 5a comprising a silicon nitride film acts as an etching stopper. The subsequent procedure is the same as in Embodiment 1.

Figure 6B:
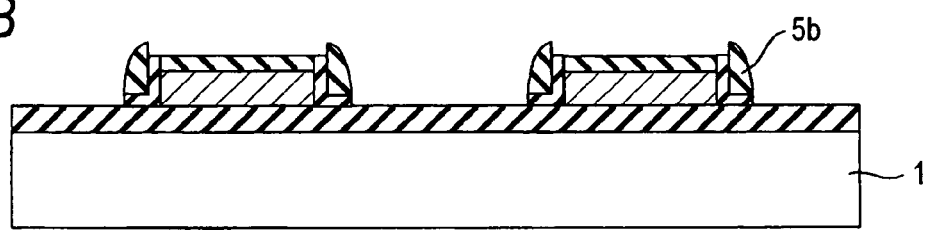

That is, the first insulating film used as an etching stopper film is removed by etching (FIG. 6B). At this time, the first insulating film 5a in the portion covered by the second insulating film remains.

Figure 6C:
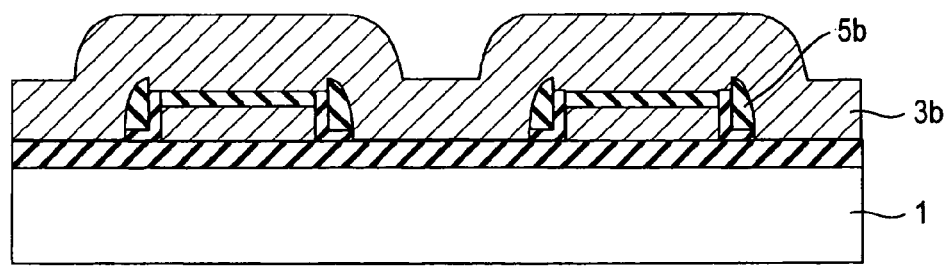

Subsequently, a polycrystalline silicon film as the second conductive film 3b is formed thereon by a reduced-pressure CVD method to a thickness larger than the height of the first conductive film 3a. At this time, the substrate temperature is set to 500 to 600° C. (FIG. 6C).

Figure 6D:
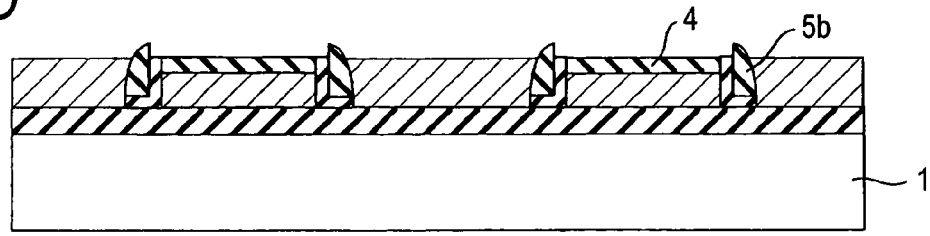

Furthermore, the second conductive film 3b in the projected portions is removed by an etch back process to flatten the surface (FIG. 6D). In this way, the charge transfer section is formed.

Thereafter, an HTO film 7 having a film thickness up to 50 nm is formed by a reduced-pressure CVD method, and patterning of the second layer electrode (second conductive film) is performed, thereby opening a window in the photoelectric conversion section.

After forming an intermediate layer 70 such as antireflection film, light-shielding layer and flattening layer, a color filter 50, a microlens 60 and the like are formed to obtain a solid-state imaging device illustrated in FIGS. 1 and 2.

According to this solid-state imaging device, the gate oxide film having film loss is supplemented by a CVD silicon oxide film, so that the characteristics can be maintained without deterioration.

At the time of patterning the first layer electrode, the patterning of the first layer electrode may also be performed by using a two-layer film consisting of a silicon oxide film 4a and a silicon nitride film 4b, as the hard mask.

In this Embodiment, the film loss of the interlayer insulting film at the electrode patterning is compensated for by additional CVD, so that characteristic deterioration can be prevented.

Embodiment 4

In this Embodiment, the film loss generated at the removal of the first insulating film used as the stopper film on the gate oxide film 2 is supplemented by a CVD method.

Figure 7A:
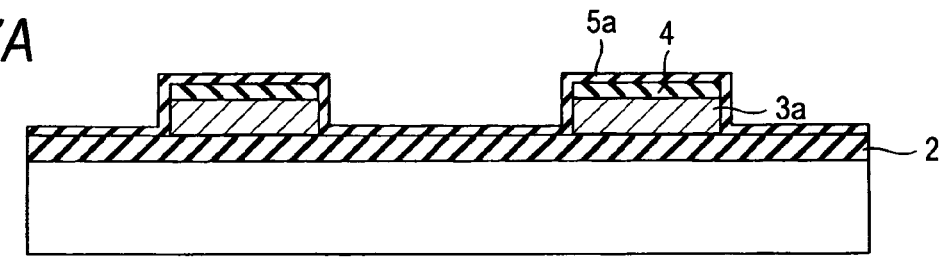
FIGS. 7A to 7D are views that illustrate the production process of the solid-state imaging device in Embodiment 4 of the present invention.

After the step illustrated in FIG. 4A, as illustrated in FIG. 7A, a silicon oxide film 5C is added by a CVD method. The subsequent fabrication procedure is the same as in Embodiment 1.

Figure 7B:
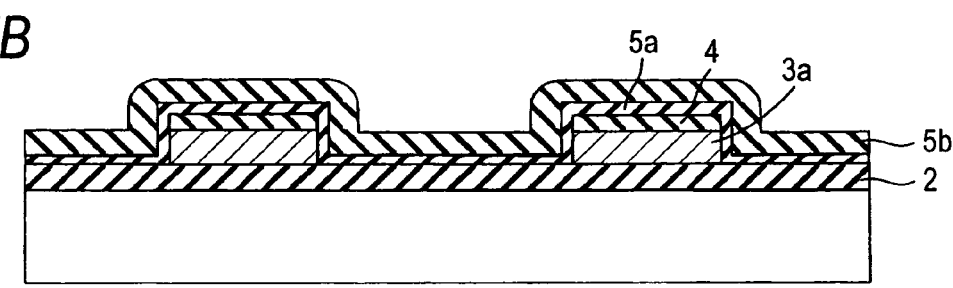
Figure 7C:
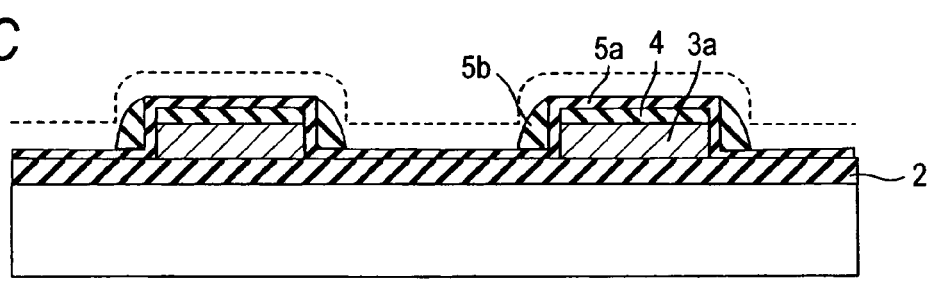

As illustrated in FIGS. 7A to 7C, a second insulating film 5b working out to a sidewall is formed and subjected to anisotropic etching in the same manner as in FIGS. 4A to 4C.

Figure 7D:
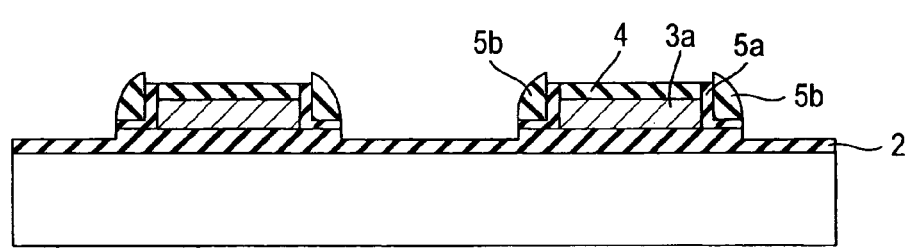
Figure 8A:
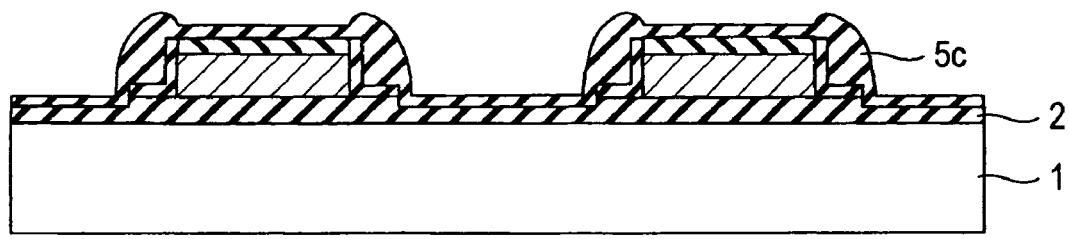
FIGS. 8A to 8C are views that illustrate the production process of the solid-state imaging device in Embodiment 4 of the present invention.
Figure 8B:
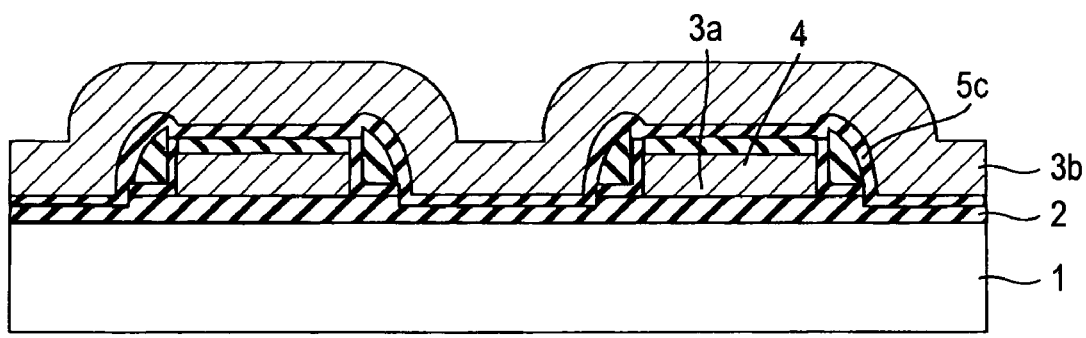
Figure 8C:
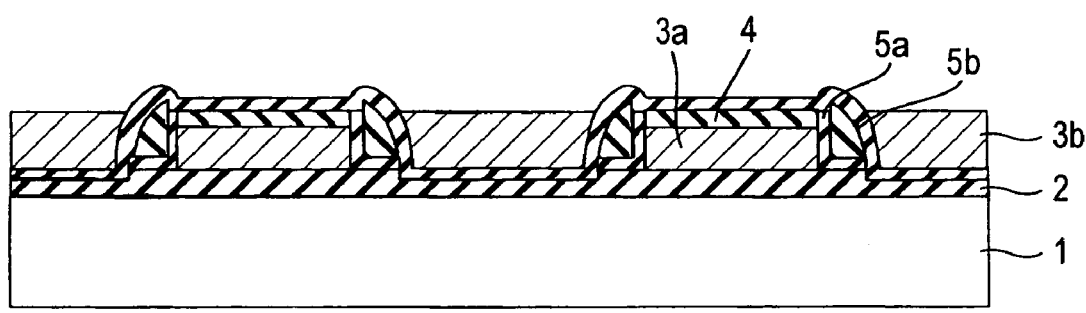

Thereafter, as illustrated in FIG. 7D, the silicon nitride film in the second electrode-forming region is removed. At this time, the silicon oxide film 2 as a gate oxide film below the second layer electrode is partially removed by etching.

In order to compensate for this film loss, a silicon oxide film 5c is formed by a CVD method.

Subsequently, a second layer polycrystalline silicon film is formed in the same manner and etch-backed to form a second layer electrode 3b.

Incidentally, in Embodiments 1 to 4, the electrode is constituted by a polycrystalline silicon layer, but a tungsten film may be formed on the polycrystalline silicon layer working out to the first layer electrode and heat-treated, thereby effecting silicidation to form tungsten silicide. In this case, the resistance of the electrode can be reduced and more reduction in the thickness can be attained. Alternatively, the silicidation may be performed simultaneously with the subsequent silicidation of the second layer electrode.

Also, the high dielectric thin film used as the first insulating film may be appropriately changed to that other than the aluminum oxide used in Embodiment 1.

In the Embodiments above, a charge transfer electrode having a single-layer electrode structure is described, but the same is applicable also to a charge transfer electrode having a two-layer electrode structure.

At this time, a mask needs to be used at the patterning of not only the first layer electrode but also the second layer electrode. In the patterning of these first and second layer electrodes, a two-layer film consisting of a silicon oxide film and a silicon nitride film may be used as the hard mask. By virtue of constructing the hard mask by a two-layer film, not only the pattern precision but also the reliability as an insulating film are enhanced. Moreover, in the flattening step by CMP or resist etch back, where separation of the electrode is also effected, the film acts as a removal-preventing layer (etching stopper) and therefore, the yield can be more enhanced.

The metal constituting the silicide is not limited to tungsten but may be appropriately changed to titanium (Ti), cobalt (Co), nickel (Ni) or the like. Also, the silicon layer is not limited to the polycrystalline silicon but may be appropriately changed to an amorphous silicon layer, a microcrystalline silicon layer or the like.

Furthermore, the production method is not limited to the above-described Embodiments but may be appropriately changed.

The present application claims foreign priority based on Japanese Patent Application (JP 2005-284827) filed Aug. 8, 2005, the contents of which is incorporated herein by reference.

What is claimed is:

1. A solid-state imaging device comprising:
   a semiconductor substrate;
   a photoelectric conversion section;
   a charge transfer section comprising a charge transfer electrode transferring an electric charge generated in the photoelectric conversion section,
   the charge transfer electrode comprising:
   a first electrode comprising a first conductive film; and
   an adjacent second electrode comprising a second conductive film;
   a gate oxide film at least below the first electrode consists of a silicon oxide film, the silicon oxide film is in direct contact with both of the first electrode and the semiconductor substrate, the first electrode and the adjacent second electrode being disposed on the gate oxide film and alternatively arranged; and
   a interelectrode insulating film comprising a sidewall insulating film covering a lateral wall of the first electrode, the interelectrode insulating film separating and insulating the first electrode from the adjacent second electrode,
   the sidewall insulating film comprises:
   a first insulating film including a lateral wall portion covering and directly contacting the lateral wall of the first electrode and an L-shaped portion forming a substantially right angled region between the lateral wall portion and the L-shaped portion covering and directly contacting with the top of the gate oxide film between the first electrode and the adjacent second electrode; and
   a second insulating film different from the first insulating film, provided on the first insulating film in the substantially right angled region between lateral sides of the first and the adjacent second electrodes and the second insulating film directly contacting the adjacent second electrode.

2. The solid-state imaging device as claimed in claim 1, wherein the first insulating film comprises a metal oxide thin film having an insulation property.

3. The solid-state imaging device as claimed in claim 2, wherein the metal oxide thin film comprises at least one element selected from the group consisting of Al, Ti, Hf, Zr, La and Y.

4. The solid-state imaging device as claimed in claim 1, wherein the first insulating film comprises a silicon nitride film.

5. The solid-state imaging device as claimed in claim 1, wherein the second insulting film has an etching selectivity to the first insulating film.

6. The solid-state imaging device as claimed in claim 1, wherein the second insulating film comprises a silicon oxide film.

7. The solid-state imaging device as claimed in claim 6, wherein the silicon oxide film comprises a silicon oxide film formed by a chemical vapor deposition method.

* * * * *